(12) United States Patent
Tang

(10) Patent No.: US 6,809,979 B1
(45) Date of Patent: Oct. 26, 2004

(54) COMPLETE REFRESH SCHEME FOR 3T DYNAMIC RANDOM ACCESS MEMORY CELLS

(75) Inventor: Robin Tang, San Jose, CA (US)

(73) Assignee: Fernandez & Associates, LLP, Menlo Park, CA (US)

( * ) Notice: Subject to any disclaimer, the term of this patent is extended or adjusted under 35 U.S.C. 154(b) by 0 days.

(21) Appl. No.: 10/379,859

(22) Filed: Mar. 4, 2003

(51) Int. Cl.$^7$ .................................................. G11C 7/00
(52) U.S. Cl. .............. 365/222; 365/189.01; 365/189.04
(58) Field of Search ........................... 365/222, 189.01, 365/189.04

(56) References Cited

U.S. PATENT DOCUMENTS 5,812,476 A * 9/1998 Segawa ...................... 365/222
5,995,433 A * 11/1999 Liao ........................... 365/222
6,671,210 B2 * 12/2003 Watanabe et al. ........... 365/187

* cited by examiner

Primary Examiner—Richard Elms
Assistant Examiner—Pho M. Luu
(74) Attorney, Agent, or Firm—Fernandez & Associates, LLP

(57) ABSTRACT

A refresh scheme for a semiconductor memory macro that comprises three-transistor dynamic random access memory (3T-DRAM) cells. Similar to an internal refresh operation, an external access command is also interpreted as a read-then-write operation. A clock cycle is partitioned as a plurality of time slots by an internal clock generator. Each time slot is assigned to execute a specific memory cell operations, whereby array idle time typically needed for performing exclusively non-array operations is no longer required. An external access and an internal refresh can be operated sequentially without degrading speed performance. An internal refresh can occur in every clock cycle period to retain the stored data. This clock cycle period is less than the time required for consecutively performing the external access and thereafter the internal refresh upon the completion of the external access.

57 Claims, 4 Drawing Sheets

COMPLETE REFRESH SCHEME FOR 3T DYNAMIC RANDOM ACCESS MEMORY CELLS

FIELD OF THE INVENTION

The invention relates to dynamic random access memory (DRAM), particularly to three-transistor (3T) DRAM.

BACKGROUND

Various forms of static and dynamic semiconductor storage cells are known in the art. Static cells (usually 6T-SRAM) continue to store data for as long as power is applied to them. In contrast, a dynamic storage cell (e.g., 1T-DRAM, 3T-DRAM or 4T-DRAM) must be periodically refreshed or it loses the stored data. Static cells are generally faster, consume less power and have lower error rates, but have the disadvantage of requiring more space on a semiconductor chip. Generally speaking, refreshing scheme on the dynamic storage cells only creates the pseudo static storage cells because the external access command is unpredictable and can't be executed when the heavy external access occurs and interferes with the internal refresh operation. One way to solve the access/refresh conflict problem is to insert the refresh operation after the external access operation in the same clock cycle but it causes more cycle time or poorer performance.

Various conventional circuitries use the dynamic storage cells but provide the static storage effect to reduce the space on the semiconductor chip. 4-T SRAM cell is given a higher leaky current from the pre-charged bit line to the storage node via the pass transistor to retain the data. 1T-DRAM is the smallest in area but the capacitor included in the memory cell has a three-dimensional configuration that increases the process numbers and the production cost. Moreover, because of the required destructive read and write-back, access time is increased when compared with a case in which 6T-SRAM is employed. As such, these are not suitable for system-on-chip (SOC) applications since most of these SOC applications use the generic process provided by the majority of the foundries.

A three-transistor DRAM (3T-DRAM) cell (see FIG. 1) is not required to conduct the process to form a capacitor having a three-dimensional structure and can be fabricated in the same transistor processes as for the memory including 6T-SRAM. The access speed can be similar to the 6T-SRAM since the 3T-DRAM read operation is non-destructive. However, 3T-DRAM has the drawback of needing more frequent refresh operations to retain the data due to a small storage capacitance in the memory cell. This increases the possibility of conflict between an access to the 3T-DRAM cell for external access and an internal access for the refresh operation. Thus, for 3-T DRAM, a need exists to have internal refresh operation running independently in the memory block no matter what the external access is, such that the speed advantage of 6T-SRAM and the area advantage of DRAM can be obtained at the same time.

BRIEF DESCRIPTION OF THE FIGURES

The accompanying drawings which are incorporated in and form a part of this specification, illustrates embodiments of the invention and together with the description, serve to explain the principles of the invention.

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
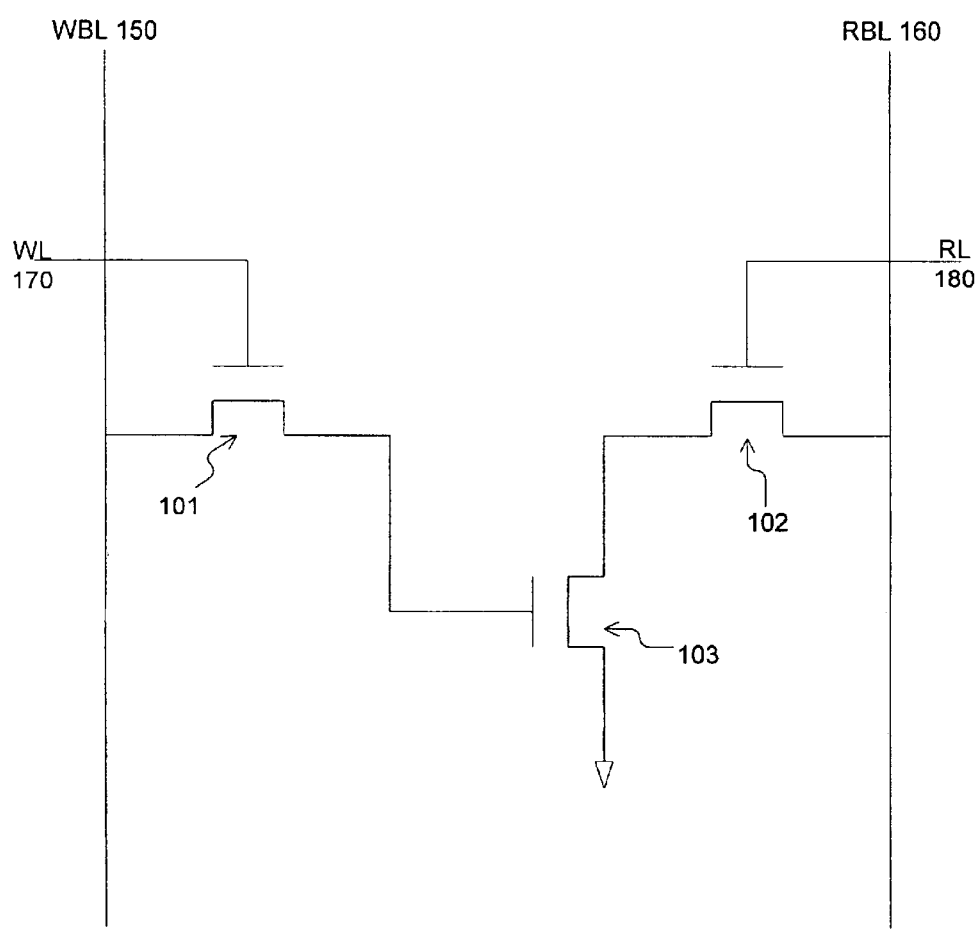
FIG. 1 shows a three-transitor dynamic random access memory (3T-DRAM) cell that is deployed in a DRAM refreshing scheme in accordance with one embodiment of the invention.

Referring now to FIG. 1, a three-transistor dynamic random access memory (3T-DRAM) cell 100 is shown for facilitating description of a 3T-DRAM refreshing scheme in accordance with various embodiments of the invention. In accordance with the present invention, an SRAM compatible device is designed using cells such as 3T-DRAM cell 100, whose transistors can be the same type of devices or any combination.

As shown, transistors 101, 102 are pass transistors that couple respectively with a write bit line (WBL) 150 and a read bit lines (RBL) 160. Activation of transistors 101 and 102 are respectively controlled by a write word line (WL) 170 and a read word line (RL) 180. A third transistor 103 provides the gate capacitance to retain the data and the cell current for the read operation.

As will be described below, the design of 3T-DRAM cell 100 is incorporated into a DRAM refreshing scheme in accordance with various embodiments of the invention.

Figure 2:
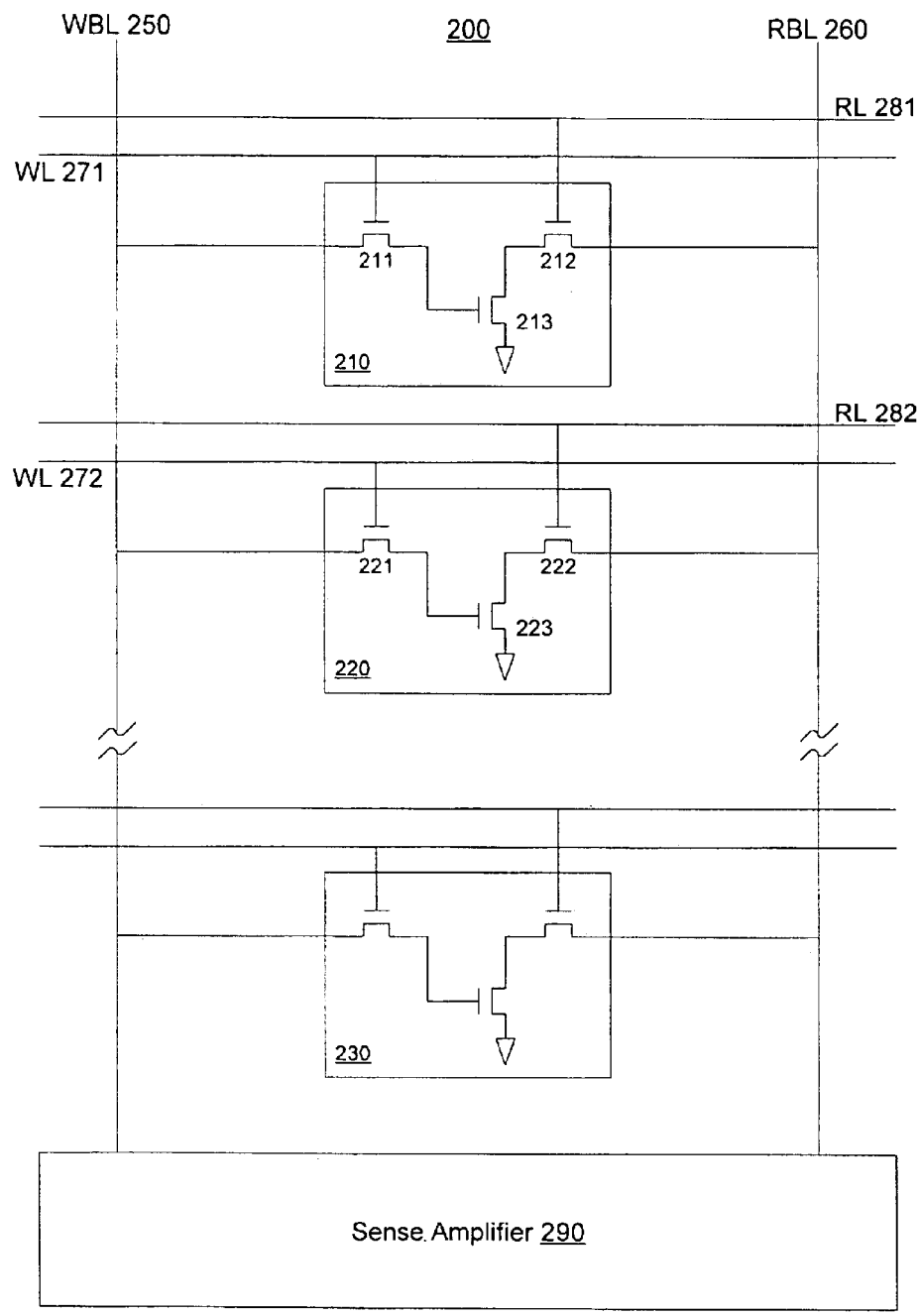
FIG. 2 shows a sub-array of a 3T-DRAM that is deployed in a DRAM refreshing scheme in accordance with one embodiment of the invention.

Referring now to FIG. 2 in view of FIG. 1, a 3-T DRAM sub-array 200 is shown in accordance with one embodiment of the invention. Sub-array 200 comprises a sense amplifier (SA) 290, 3T-DRAM cells 210–230, WBL 250, RBL 260, WL's 271–272, and RL's 281–282. Although not explicitly shown here in FIG. 2, many other cells beside cells 210–230 are understood to be parts of sub-array 200.

Coupled to both WL 271 and RL 281, cell 210 is coupled to SA 290 via WBL 250 and RBL 260. Similar to cell 100 (as shown in FIG. 1), cell 210 as shown in FIG. 2 comprises three transistors 211–213. Transistors 211–212 are pass transistors that couple with WBL 250 and RBL 260. Activations of transistors 211 and 212 are respectively controlled by WL 271 and RL 281. Transistor 213 provides the gate capacitance to retain the data and the cell current for the read operation.

Coupled to both WL 272 and RL 282, cell 220 is coupled to SA 290 via WBL 250 and RBL 260. Similar to cell 100 (as shown in FIG. 1), cell 220 as shown in FIG. 2 comprises three-transistors 221–223. Transistors 221–222 are pass transistors that couple with WBL 250 and RBL 260. Activations of transistors 221 and 222 are respectively controlled by WL 272 and RL 282. Transistor 223 provides the gate capacitance to retain the data and the cell current for the read operation.

In the present embodiment, an external memory access to a cell in sub-array 200 comprises a read followed by a write.

As an example, for a write operation to cell 210, WL 271 is asserted to couple WBL 250 to the gate capacitance of transistor 213. Thus, the voltage on WBL 250 will be written into the gate capacitance of transistor 213 and the charge will be retained for a certain time after de-asserting WL 271.

For a read operation to cell 210, RL 281 is asserted to couple RBL 260 to the drain node of transistor 213. Transistor 213 provides one-way current to RBL 260 for the data sensing when transistor 213 is on. Otherwise, no current is provided to RBL 260 when transistor 213 is off.

As shown, RBL 260 coupled to the numerous memory cells is coupled to sense amplifier 290. Sense amplifier 290 can sense, amplify the voltage/current change on RBL 260. In turn, RBL 260 is decoupled from sense amplifier 290 such that RBL 260 may be pre-charged after sense amplifier 290 is activated. In the mean time, sensed data will be latched in sense amplifier 290 and transferred to WBL 250 or to an external data bus.

On the other hand, the sensed data may be updated by the external data bus for the external write operation. After writing the data to the memory cells of sub-array 200, WBL 250 may be pre-charged and sense amplifier 290 may be pre-charged and equalized.

As understood herein, since the sensed data has been latched and isolated from RBL 260, for the memory cells of sub-array 200 (i.e., memory cells that share RBL 260 and WBL 250), a memory cell with the asserted read word line RL does not interfere with the other cell with the asserted write word line WL.

As mentioned above, the possibility of the conflict between an external memory access and an internal memory refresh is increased due to the small storage capacitance. Thus, sub-array 200 is likely to require an internal refresh operation every clock cycle. For the memory array operation, a memory cell is only accessed in a portion of the clock cycle. The rest of the clock cycle can be non-memory array operations such as address decoding, data output etc.

For high-density memory block, the memory array access time may occupy only a small portion of the clock cycle. In the present embodiment of the invention, the memory array that includes sub-array 200 is preferably arranged in a way such that the memory array operation only takes half or less of the clock cycle. That is, the memory array can be accessed twice in one clock cycle. In other words, both the external access and the internal refresh combined can be executed in one clock cycle period. This can be done by partitioning the memory array into the small grains of the sub-arrays (e.g., sub-array 200) such that the asserted sub-array can be freed up for the next internal refresh operation after the external access while the data registered at the local sense amplifier transfer to the output buffer.

On the other hand, the memory array is preferably arranged in a way such that when the write word line is asserted, the numerous memory cells will be written from the write bit lines. Since the write data are less than the number of the memory cells accessed, some of them are required to do the read-then-write-back operation similar to the internal refresh operation. Therefore, whether read or write external access is performed, the memory operation can be partitioned in two steps (read and write) and executed in a read-then-write order.

For the external read access, the write portion is similar to the internal refresh operation. Or, the external read access can be skipped without losing the data.

For the external write access to those memory cells not written by the external data bus, the write portion is similar to the internal refresh operation. Since the refresh operation is a read-then-write-back operation, the external access operation and the refresh operation can be interleaved. That is, the memory access can be operated in an order of the external read, external write/internal refresh read and internal refresh write, wherein external write and internal refresh read overlap. The internal refresh write can be extended to the next clock cycle before the external read occurs.

For 3T-DRAM memory cells, separate word line and bit line are used respectively for the read and write. As such, for example, an external write to cell 210 and an internal refresh read to cell 220 can be executed at the same time without interfering each other. Thus, memory speed is not degraded and the refresh operation can be executed in every clock cycle period no matter what the external operation is.

Figure 3:
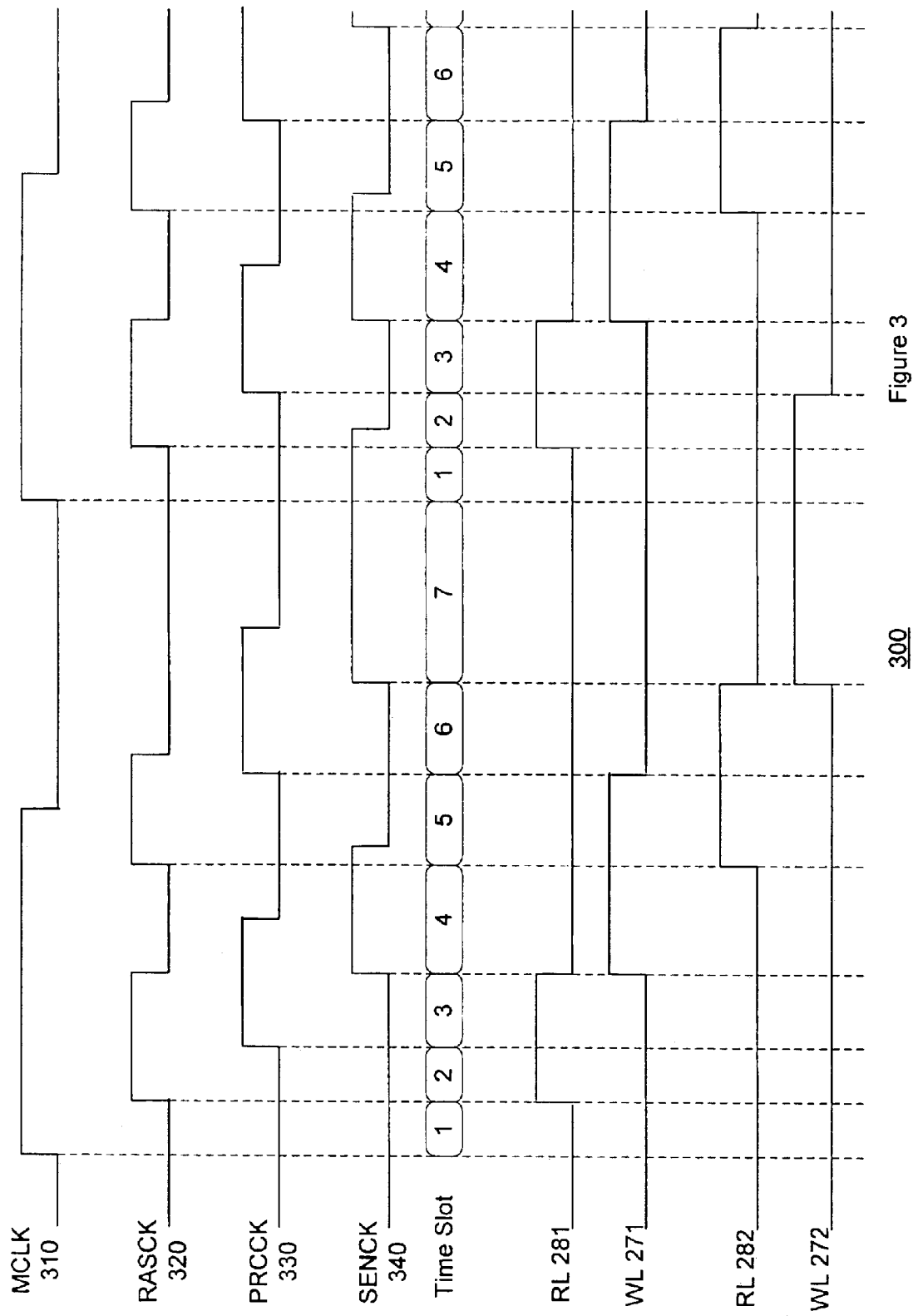
FIG. 3 shows a timing diagram of a DRAM refreshing scheme for a 3T-DRAM in accordance with one embodiment of the invention.

Referring now to FIG. 3 in view of FIG. 2, a timing diagram 300 is shown for 3-T DRAM sub-array 200 in accordance with one embodiment of the invention. To interleave the external access and internal refresh, a clock cycle is first partitioned into time slots. In turn, operations to be performed are assigned to their respective pre-defined time slots. As understood herein, a clock cycle partition need not be limited to the clock cycle partition as shown here. For example, in another embodiment, a clock cycle is partitioned into a different number of time slots than the one shown in timing diagram 300.

MCLK 310 is the external clock. RASCK 320, PRCCK 330 and SENCK 340 are the internally generated clock signals derived from MCLK 310 or from each other. RASCK 320, PRCCK 330 and SENCK 340 have two pulses in one MCLK 310clock cycle. RASCK 320 can be generated from the rising edge of MCLK 310 or the rising edge of SENCK 340 when MCLK 310 is high.

The first pulse of PRCCK 330 can be obtained from RASCK 320 after the predetermined delay line. The second pulse of PRCCK 330 can be obtained either from RASCK 320 after the pre-determined delay line or after the MCLK 310 high goes low depending on which is later. SENCK 340 can be obtained from PRCCK 330 after the pre-determined delay line. Each delay line is associated with the timing of the memory operation, and is furthermore adjusted to guarantee the proper memory operation.

Specifically, by gating with MCLK 310, RASCK 320, PRCCK 330 and SENCK, 7 independent time slots can be created in the present embodiment.

As shown, time slot 1 is from the rising edge of MCLK 310 to the rising edge of RASCK 320.

Time slot 2 is from the rising edge of RASCK 320 to the rising edge of PRCCK 330.

Time slot 3 is from the rising edge of PRCCK 330 to the rising edge of SENCK.

Time slot 4 is from the rising of SENCK 340to the rising edge of the second pulse of RASCK 320.

Time slot 5 is either from the rising edge of the second pulse of RASCK 320 to the rising edge of the second pulse of PRCCK 330 or the falling edge of MCLK 310 to the rising edge of the second pulse of PRCCK 330.

Time slot 6 is from the rising edge of the second pulse of PRCCK 330 to the rising edge of the second pulse of SENCK.

Time slot 7 is from the rising edge of the second pulse of SENCK 340 to the next rising edge of MCLK 310.

In terms of memory cell operations, time slot 2, 3, 4 and 5 are dedicated for external access operation. Time slot 5, 6, 7, 1 (next cycle), 2 (next cycle) are dedicated for internal refresh operation. Both start from the rising edge of RASCK 320 to the rising edge of the next following PRCCK 330. As understood herein, the memory array can be arranged so that time slot 6 and 7 as well as 3 and 4 can be reduced. Thus, inserting the refresh operation after the external operation will not degrade the speed performance.

More specifically, at time slot 1, the external addresses are registered and decoded.

At time slots 2 and 3, read word line (RL) 281 is asserted associated with the external addresses no matter the external operation is read or write.

At time slot 4, read sense amplifier 290 latches voltage differential at read bit line (RBL) 260. In turn, RBL 260 may be pre-charged to a pre-defined voltage level.

At time slots 4 and 5, the write word line WL associated with a cell being accessed externally can be asserted for the external write operation. For the external read operation, this operation can be skipped. For the refresh operation, the refresh addresses can be registered and decoded before time slot 5. For example, in the scenario shown in FIG. 3, when performing an external access to cell 210, WL 271 can be asserted for the external write operation. For the external read operation, this operation can be skipped. For the refresh operation to be performed in the same clock cycle in cell 220, the refresh addresses can be registered and decoded before time slot 5.

At time slots 5 and 6, RL 282 associated with the refresh addresses can be asserted after RBL 260 is pre-charged at time slot 4. As shown here, the external write operation is overlapped with the internal refresh read operation at time slot 5. Since the read data have been latched at sense amplifier 290, any change on RBL 260 won't affect the data being written to the memory cell. In the case where row addresses are the same for both the external write and refresh operation, the refresh operation on this row can be skipped without losing any data.

At time slot 6, WL 271 associated with the external addresses is de-asserted. The write bit line WBL may be pre-charged and the sense amplifier may be pre-charged and equalized.

At time slot 7, read sense amplifier 290 latches/amplifies the data on RBL 260 and RBL 260 may be pre-charged at time slot 7 and the next cycle's time slot 1. Meanwhile, the WL 272 associated with the refresh addresses will be asserted for the write-back operation for time slot 7 and the next cycle's time slots 1 and 2.

At time slot 3 of the next cycle, WL 272 associated with the previous refresh addresses will be de-asserted. WBL 250 may be pre-charged and sense amplifier 290 may be pre-charged and equalized. Thus, the external access operation and the internal refresh operation have been executed in one clock cycle period though part of the refresh operation has been extended to the next cycle. As understood herein, although part of the refresh operation extends to the next cycle, both the external access operation and refresh operation can be initiated within one clock cycle period. As such, both operations can be considered as being executed in one clock cycle period.

Figure 4:
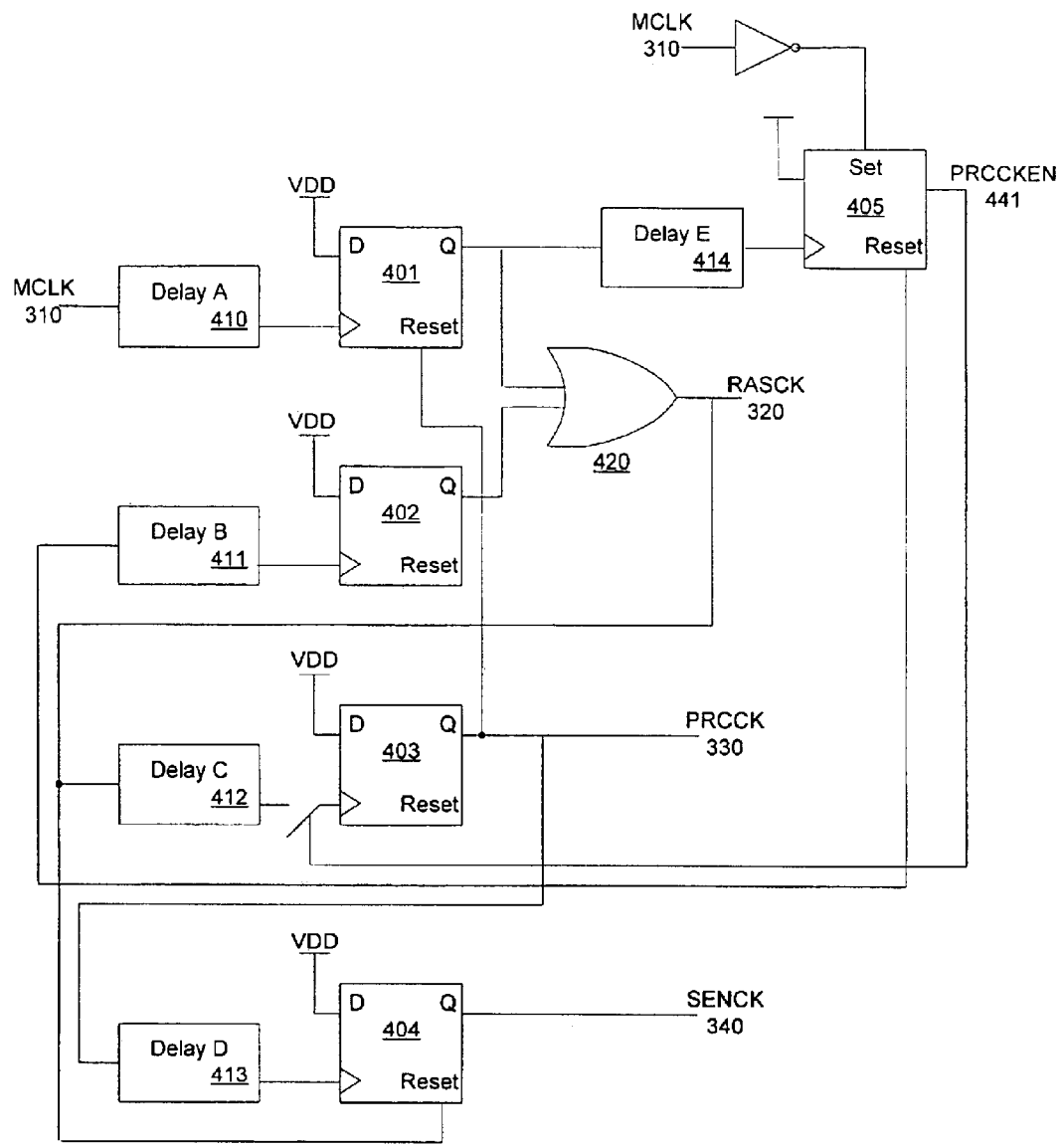
FIG. 4, shows a clock generator for a DRAM refreshing scheme of a 3T-DRAM in accordance with one embodiment of the invention.

Referring now to FIG. 4 in view of FIGS. 2 and 3, a block diagram of a clock generator 400 for a 3-T DRAM is shown in accordance with one embodiment of the invention.

For clock generator 400, flip-flops 401, 402, 403 and 404 are D-type flip-flops with the RESET input pin. A flip-flop 405 is D-type flip-flop with the SET and RESET input pins. Input D receives the data and transfers to the output Q when CK changes from low to high. Input RESET forces output Q to logic low when it is asserted regardless with CK. On the contrary, input SET pin forces output Q to logic high regardless with CK. Delay lines 410, 411, 412, 413 and 414 are the non-inverting delay lines. Additionally, an OR gate 420 and a switch 430 are also shown here.

For simplicity, the logics initializing the states of each flip-flop is not drawn in FIG. 4. However, after the initialization or the power-on reset, RASCK 320, PRCCK 330 and PRCCKEN 441 are reset to logic low. SENCK 340 is set to logic high. When MCLK 310 changes from logic low to logic high and propagates through DELAY A 410, RASCK 320 will be set to logic high via D flip-flop 401. In turn, RASCK 320 will reset SENCK 340 to logic low. The delay time from DELAY A (time slot 1 in FIG. 3) is understood to be greater than the time to latch and decode the external addresses. The output Q of D flip-flop 401 also sets PRCCKEN 441 to logic high after the delay from DELAY E when SENCK 340 is logic low. DELAY E is used to guarantee signal PRCCKEN 441 can be set to logic high after the first pulse of RASCK 320 is asserted.

Continuing with FIG. 4, once the signal PRCCKEN 441 is asserted, switch 430 is closed so the first pulse of RASCK 320 can propagate to D flip-flop 403 and cause PRCCK 330 to change from low to high. In turn, PRCCK 330 comes back to D flip-flop 401 and 402 to reset RASCK 320. PRCCK 330 will set SENCK 340 to logic high after propagating through DELAY D. In turn, SENCK 340 will come back to D flip-flop 403 to reset PRCCK 330 to logic low.

As understood herein, the combined delay time for DELAY C and DELAY D (see time slots 2 and 3 shown in FIG. 3) is understood to be greater than the time to turn on the read word line and build up enough voltage or current change on the read bit line before the sense amplifier is activated.

Once SENCK 340 is set to high, the signal PRCCKEN 441 will be reset to logic low and force the switch 430 to be open. At the same time, SENCK 340 propagates through DELAY B and asserts RASCK 320 via D flip-flop 402. The delay time from DELAY B (time slot 4 shown in FIG. 3) is understood to be greater than the time required to pre-charge the read bit line. The second pulse of RASCK 320 can not set PRCCK 330 high when the switch 430 is open. PRCCKEN 441 will be set to logic high again once MCLK 310 changes from high to low. The delay time from the rising edge of the second pulse of RASCK 320 to the second pulse of PRCCK 330 is either the delay from DELAY C or the elapsed time from the second rising edge of RASCK 320 to the falling edge of MCLK 310 and depends on which comes later.

As understood herein, the above delay and the delay time for DELAY B together are understood to be greater than the time required to write the data from the write bit line to the memory cell. Again, SENCK 340 is set high by the PRCCK 330 after the delay of DELAY D and remains the logic high until RASCK 320 is asserted in the next clock cycle.

Also as understood herein, when the external clock speed is lower than expected (This usually happens in system-on-chip application), the time (time slots 5 and 7 in FIG. 3) allowed for the memory cell's read and write can be extended automatically by the external clock cycle time except for the first memory read time (i.e., time slots 2 and 3 shown in FIG. 3). This approach can also be adjusted to give more margin for the memory read by tuning the delay time of DELAY C and DELAY D. Thus, each time slot in one clock cycle can be optimized to give the best margin for the memory read and write for both external access and internal refresh.

The foregoing description of specific embodiments of the invention have been presented for purposes of illustration and description. They are not intended to be exhaustive or to limit the invention to the precise forms disclosed. Obviously, many modifications and variations are possible in light of the above teaching. The embodiments were chosen described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A method for refreshing three-transistor dynamic random access memory (3T-DRAM) cells of a 3T-DRAM sub-array, the method comprising the steps of:
   a) in a clock cycle, initiating an external access operation on a first cell; and
   b) in the clock cycle, before completing the external access operation on the first cell, initiating an internal refresh operation on a second cell of the sub-array, wherein the duration of the external access operation and the duration of the refresh operation overlaps to allow both the external access operation and the internal refresh operation to be completed effectively in one clock cycle period that is less than the time required for consecutively performing the external access operation and thereafter the internal refresh operation upon the completion of the external access operation.

2. The method of claim 1, wherein the external access operation is adapted to be performed as an external read access followed by an external write access.

3. The method of claim 2, wherein the internal refresh operation is adapted to be performed as an internal read access followed by an internal write access.

4. The method of claim 3, wherein the internal refresh write can be extended to a next clock cycle before a next external read operation is performed to the 3T-DRAM sub-array.

5. The method of claim 1, wherein said step b) further comprising the step of:
   b1) inhibiting the internal refresh operation for the clock cycle in response to the second cell being externally access in the clock cycle.

6. The method of claim 1, wherein said step c) further comprising the step of:
   c1) inhibiting the internal refresh operation for the clock cycle in response to the second cell being externally access in the clock cycle.

7. A method for refreshing a three-transistor dynamic random access memory (3T-DRAM), the method comprising the steps of:
   a) in a clock cycle, while performing non-array operations, performing array operation of external access to a first cell of the 3T-DRAM sub-array to eliminate array idle time, wherein no portion of the clock cycle need to be devoted exclusively to non-array operations; and
   b) in the clock cycle, while performing non-array operations, performing array operation of internal refresh to a second cell of the 3T-DRAM sub-array to eliminate array idle time, wherein no portion of the clock cycle need to be devoted exclusively to non-array operations.

8. The method of claim 7, wherein the external access operation is adapted to be performed as an external read access followed by an external write access.

9. The method of claim 8, wherein the internal refresh operation is adapted to be performed as an internal read access followed by an internal write access.

10. The method of claim 9, wherein the internal refresh write can be extended to a next clock cycle before a next external read operation is performed to the 3T-DRAM sub-array.

11. The method of claim 7, wherein said step b) further comprising the step of:
    b1) inhibiting the internal refresh operation for the clock cycle in response to the second cell being externally access in the clock cycle.

12. The method claim 7, wherein the non-array operations comprise address decoding and data output.

13. A method for accessing a three-transistor dynamic random access memory (3T-DRAM) sub-array, the method comprising the steps of:
    a) partitioning a clock cycle to begin with a first time segment and end with a second time segment, wherein the first time segment overlaps with the second time segment;
    b) assigning the first time segment of the clock cycle for performing an external access operation on a first cell of the 3T-DRAM sub-array; and
    c) assigning the second time segment of the clock cycle for performing an internal refresh operation on a second cell of the 3T-DRAM sub-array, wherein one internal refresh operation can be performed in every clock cycle period that is less than the time required for consecutively performing the external access operation and thereafter the internal refresh operation upon the completion of the external access operation.

14. The method of claim 13, wherein the external access operation is performed as an external read access followed by an external write access.

15. The method of claim 13, wherein the internal refresh operation is performed as an internal refresh read access followed by an internal refresh write access.

16. The method of claim 13, said step a) further comprising the steps of:
    a1) partitioning the first time segment into a plurality of time slots that are used for a read access followed by a write access to the first 3T-DRAM cell; and
    a2) partitioning the second time segment into a second plurality of time slots that are used for a read access followed by a write access to the second 3T-DRAM cell, wherein the beginning time slot of the second plurality of time slots overlaps with the ending time slot of the first plurality of the time slots.

17. The method of claim 16, wherein the internal refresh write can be extended to a next clock cycle before a next external read operation is performed to the 3T-DRAM sub-array.

18. The method of claim 13, wherein said step c) further comprising the step of:
    c1) inhibiting the internal refresh operation for the clock cycle in response to the second cell being externally access in the clock cycle.

19. A method for refreshing a three-transistor dynamic random access memory (3T-DRAM) sub-array, the method comprising the steps of:

a) partitioning a clock cycle into a plurality of time slots;
b) assigning each of the time slots to perform a memory cell operation; and
c) interleaving an external access operation and an internal refresh operation to the 3T-DRAM sub-array, wherein the internal refresh operation can occur in every clock cycle period, wherein the clock cycle period is less than the time required for consecutively performing the external access operation and thereafter the internal refresh operation upon the completion of the external access operation.

20. The method of claim 19, comprising the step of:
interpreting an external access command as a read-then-write operation, wherein the external access operation is adapted to be performed as an external read access followed by an external write access.

21. The method of claim 20, wherein the internal refresh operation is adapted to be performed as an internal refresh read access followed by an internal refresh write access.

22. The method of claim 21, wherein the internal refresh write can be extended to a next clock cycle before a next external read operation is performed to the 3T-DRAM sub-array.

23. A method for accessing a three-transistor dynamic random access memory (3T-DRAM) sub-array, the method comprising the steps of:
a) partitioning a clock cycle into a plurality of time slots;
b) designating each of the plurality of time slots for performing an array operation for the 3T-DRAM subarray, wherein no idle array time is necessary in the clock cycle; and
c) interleaving the array operations of an external access and an internal refresh, wherein the internal refresh can occur in every clock cycle period that is less than the time required for consecutively performing the external access operation and thereafter the internal refresh operation upon the completion of the external access operation.

24. The method of claim 23, wherein the external access operation is adapted to be performed as an external read access followed by an external write access.

25. The method of claim 24, wherein the internal refresh operation is adapted to be performed as an internal read access followed by an internal write access.

26. The method of claim 25, wherein the internal refresh write can be extended to a next clock cycle before a next external read operation is performed to the 3T-DRAM sub-array.

27. The method of claim 23, wherein said step c) further comprising the step of:
c1) inhibiting the internal refresh operation for the clock cycle in response to the second cell being externally access in the clock cycle.

28. A method for refreshing three-transistor dynamic random access memory (3T-DRAM) cells of a 3T-DRAM sub-array, the method comprising the steps of:
a) partitioning a clock cycle into a first plurality of time slots and a second plurality of time slots, the clock cycle beginning with the first time slot of the first plurality of time slots, the clock cycle ending with the last time slot of the second plurality of time slots, wherein the last time slot of the first plurality of time slots overlaps the first time slot of the second plurality of time slots;
b) allocating the first plurality of time slots for performing external memory access to a first cell in the 3T-DRAM sub-array; and c) allocating the second plurality of time slots for performing internal refresh to a second cell in the 3T-DRAM sub-array.

29. The method of claim 28, wherein the external memory access operation is adapted to be performed as an external read access followed by an external write access.

30. The method of claim 29, wherein the internal refresh operation is adapted to be performed as an internal read access followed by an internal write access.

31. The method of claim 30, wherein the internal refresh write can be extended to a next clock cycle before a next external read operation is performed to the 3T-DRAM sub-array.

32. The method of claim 28, wherein said step c) further comprising the step of:
c1) inhibiting the internal refresh operation for the clock cycle in response to the second cell being externally access in the clock cycle.

33. A method for refreshing three-transistor dynamic random access memory (3T-DRAM) cells of a 3T-DRAM sub-array, the method comprising the steps of:
a) in a clock cycle, in response to an external access command for a first cell of the sub-array, performing an external access operation that begins with an external read on the first cell;
b) in the clock cycle, following completion of the external read, performing external write on the first cell; and
c) in the clock cycle, in response to an internal refresh command for a second cell of the sub-array, before completing the external write on the first cell, performing an internal refresh operation on the second cell, wherein both external access operation and the internal refresh operation are performed effectively in one clock cycle period, wherein the clock cycle period is less than the time required for consecutively performing the external access operation and thereafter the internal refresh operation upon the completion of the external access operation.

34. The method of claim 33, wherein the external access operation is adapted to be performed as an external read access followed by an external write access.

35. The method of claim 34, wherein the internal refresh operation is adapted to be performed as an internal read access followed by an internal write access.

36. The method of claim 35, wherein the internal refresh write can be extended to a next clock cycle before a next external read operation is performed to the 3T-DRAM sub-array.

37. The method of claim 33, wherein said step c) further comprising the step of:
c1) inhibiting the internal refresh operation for the clock cycle in response to the second cell being externally access in the clock cycle.

38. A three-transistor dynamic random access memory (3T-DRAM) sub-array comprising:
a sense amplifier (SA);
a plurality of 3T-DRAM cells coupled to said SA via a write bit line (WBL) and a read bit line (RBL),
wherein of said plurality of cells a first cell that is accessible by a first write word line and a first read word line is coupled to said SA via the WBL and the RBL,
wherein of said plurality of cells a second cell that is accessible by a second write word line and a second read word line is coupled to said SA via the WBL and the RBL, and wherein the external access operation of said first cell is interleaved with the internal refresh operation to eliminate clock time devoted exclusively to non-array operation, wherein during non-array operation of the 3T-DRAM sub-array, array operation can also be performed.

39. The 3T-DRAM of claim 38, wherein the external access operation is adapted to be performed as an external read access followed by an external write access.

40. The 3T-DRAM of claim 39, wherein the internal refresh operation is adapted to be performed as an internal read access followed by an internal write access.

41. A three-transistor dynamic random access memory (3T-DRAM) sub-array comprising:
   a sense amplifier (SA);
   a plurality of 3T-DRAM cells coupled to said SA via a write bit line (WBL) and a read bit line (RBL),
   wherein of said plurality of cells a first cell that is accessible by a first write word line and a first read word line is coupled to said SA via the WBL and the RBL,
   wherein of said plurality of cells a second cell that is accessible by a second write word line and a second read word line is coupled to said SA via the WBL and the RBL, and
   wherein the external access operation of said first cell is interleaved with the internal refresh operation to eliminate clock time devoted exclusively to non-array operation, wherein during non-array operation of the 3T-DRAM sub-array, array operation can also be performed,
   wherein the internal refresh operation is adapted to be inhibited for the clock cycle in response to the second cell being externally access in the clock cycle.

42. A three-transistor dynamic random access memory (3T-DRAM) sub-array comprising:
   a sense amplifier (SA);
   a plurality of 3T-DRAM cells coupled to said SA via a write bit line (WBL) and a read bit line (RBL),
   wherein of said plurality of cells a first cell that is accessible by a first write word line and a first read word line is coupled to said SA via the WBL and the RBL,
   wherein of said plurality of cells a second cell that is accessible by a second write word line and a second read word line is coupled to said SA via the WBL and the RBL, and
wherein the external access operation of said first cell is interleaved with the internal refresh operation to eliminate clock time devoted exclusively to non-array operation, wherein during non-array operation of the 3T-DRAM sub-array, array operation can also be performed,
   wherein the external access operation is adapted to be performed as an external read access followed by external write access,
   wherein the internal refresh operation is adapted to be performed as an internal read access followed by an internal write access, and
   wherein the internal refresh write can be extended to a next clock cycle before a next external read operation is performed to the 3T-DRAM sub-array.

43. A 3-transistor dynamic random access memory (3T-DRAM) sub-array comprising:
   a first memory cell adapted to be activated by a first write word line and a first read word line; and
   a second cell adapted to be activated by a second write word line and a second read word line, wherein an external access operation on said first cell is interleaved with an internal refresh operation on said second cell, allowing both operations to be performed in one clock cycle period that is less than the time required for consecutively performing the external access operation and thereafter the internal refresh operation upon the completion of the external access operation.

44. The 3T-DRAM of claim 43, wherein the external access operation is adapted to be performed as an external read access followed by an external write access.

45. The 3T-DRAM of claim 44, wherein the internal refresh operation is adapted to be performed as an internal read access followed by an internal write access.

46. The 3T-DRAM of claim 45, wherein the internal refresh write can be extended to a next clock cycle before a next external read operation is performed to the 3T-DRAM sub-array.

47. The 3T-DRAM of claim 43, wherein the internal refresh operation is inhibited for the clock cycle in response to the second cell being externally access in the clock cycle.

48. A three-transistor dynamic random access memory (3T-DRAM) system comprising:
   a sub-array of 3T-DRAM cells; and
   a clock generator coupled to said sub-array, said clock generator adapted to issue clock signals for interleaving external access operations and internal refresh operations to said sub-array, wherein one internal refresh operation can be performed in every clock cycle period, wherein the clock cycle period is less than the time required for consecutively performing the external access operation and thereafter the internal refresh operation upon the completion of the external access operation.

49. The 3T-DRAM system of claim 48, wherein the external access operation is adapted to be performed as an external read access followed by an external write access.

50. The 3T-DRAM system of claim 49, wherein the internal refresh operation is adapted to be performed as an internal read access followed by an internal write access.

51. The 3T-DRAM system of claim 50, wherein the internal refresh write can be extended to a next clock cycle before a next external read operation is performed to said sub-array.

52. The 3T-DRAM system of claim 48, wherein an internal refresh operation to a cell of said sub-array is inhibited for a clock cycle in response to said cell being externally access in the clock cycle.

53. A DRAM system comprising:
   a sub-array comprising a first cell and a second cell;
   a first write word line and a first read word line coupled to said first cell for the array operation of enabling said first cell for accepting external access and internal refresh;
   a second write word line and a second read word line coupled to said second cell for the array operation of enabling said second cell for accepting external access and internal refresh;

a clock generator coupled to said sub-array, said clock generator adapted to issue clock signals for interleaving an external access operation to said first cell and an internal refresh operation to said second cell by performing array operations while non-array operations are being performed, wherein idle time for said write word line and said read word line is effectively eliminated by not waiting for completion of non-array operations.

54. The 3T-DRAM system of claim 53, wherein the external access operation is adapted to be performed as an external read access followed by an external write access.

55. The 3T-DRAM system of claim 54, wherein the internal refresh operation is adapted to be performed as an internal read access followed by an internal write access.

56. The 3T-DRAM system of claim 55, wherein the internal refresh write can be extended to a next clock cycle before a next external read operation is performed to said sub-array.

57. The DRAM system of claim 53, wherein in response to receiving an external access command for said second cell in a clock cycle, the internal refresh operation of said second cell is inhibited in the clock cycle.

* * * * *